United States Patent
Ishikawa et al.

(10) Patent No.: US 9,267,205 B1
(45) Date of Patent: Feb. 23, 2016

(54) FASTENER SYSTEM FOR SUPPORTING A LINER PLATE IN A GAS SHOWERHEAD REACTOR

(75) Inventors: David Ishikawa, Mountain View, CA (US); Abril Cabreros, Gilroy, CA (US); Brian Burrows, San Jose, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 832 days.

(21) Appl. No.: 13/483,779

(22) Filed: May 30, 2012

(51) Int. Cl.
*C23C 16/455* (2006.01)
*C23C 16/18* (2006.01)

(52) U.S. Cl.
CPC ..... *C23C 16/45572* (2013.01); *C23C 16/45563* (2013.01); *C23C 16/45565* (2013.01); *C23C 16/18* (2013.01)

(58) Field of Classification Search
CPC C23C 16/18; C23C 16/455; C23C 16/45563; C23C 16/45569; C23C 16/45572; C23C 16/45565
USPC .......................... 118/715; 156/345.33, 345.34
See application file for complete search history.

(56) References Cited

U.S. PATENT DOCUMENTS

| | | | |
|---|---|---|---|
| 4,993,358 A | | 2/1991 | Mahawili |
| 5,059,770 A | | 10/1991 | Mahawili |
| 5,122,391 A | | 6/1992 | Mayer |
| 5,304,398 A | | 4/1994 | Krusell et al. |
| 5,458,291 A | * | 10/1995 | Brusko et al. ............... 239/423 |
| 5,792,272 A | | 8/1998 | van Os et al. |
| 6,001,267 A | | 12/1999 | Os et al. |
| 6,090,210 A | | 7/2000 | Ballance et al. |
| 6,113,700 A | | 9/2000 | Choi |
| 7,543,547 B1 | * | 6/2009 | Kennedy et al. .......... 118/723 E |
| 7,789,961 B2 | | 9/2010 | Nelson et al. |
| 8,008,174 B2 | | 8/2011 | He et al. |
| 8,161,906 B2 | * | 4/2012 | Kadkhodayan et al. .. 118/723 E |
| 8,721,791 B2 | * | 5/2014 | Tiner et al. .................... 118/715 |
| 2003/0150874 A1 | * | 8/2003 | Meire ............................ 222/83 |
| 2003/0185729 A1 | * | 10/2003 | Ko et al. ................. 422/186.05 |
| 2005/0050708 A1 | * | 3/2005 | Huang et al. ................... 29/428 |
| 2005/0133160 A1 | * | 6/2005 | Kennedy et al. ......... 156/345.34 |

(Continued)

FOREIGN PATENT DOCUMENTS

WO WO 2009150979 A1 * 12/2009 ............. H01J 37/32

OTHER PUBLICATIONS

U.S. Appl. No. 13/316,343, "Diffusers for Making Thermal Gradient Showerheads in a MOCVD Reactor", filed Dec. 9, 2011, Inventors: D. Ishikawa et al.

(Continued)

*Primary Examiner* — Jeffrie R Lund
(74) *Attorney, Agent, or Firm* — Thomas Schneck; Gina McCarthy

(57) ABSTRACT

A fastener system and method for supporting and retaining modular insulating quartz liners with gas apertures in close proximity to corresponding apertures in diffusers of gas showerheads. Tubular fasteners have a head, a tubular shank and a foot that extend through a liner plate nozzle into a diffuser plate. A keyway in the gas diffuser, aligned and coaxial with a diffuser nozzle, allows the foot to reach an arcuate concourse through a keyway where it can be locked by bayonet turning. The keyway is machined into the diffuser by EDM and is an inversion of the fastener tip geometry rotated about the axis of the tubular shank. Each fastener and nozzle set form a coaxial path for distributing processing gas to substrates through liner and diffuser plates from a plenum in showerheads of a MOCVD reactor.

15 Claims, 3 Drawing Sheets

(56) References Cited

U.S. PATENT DOCUMENTS

| | | | |
|---|---|---|---|
| 2005/0183825 A1 | 8/2005 | DeDontney et al. | |
| 2005/0241766 A1* | 11/2005 | Dhindsa et al. | 156/345.34 |
| 2007/0092732 A1 | 4/2007 | Rose et al. | |
| 2008/0196666 A1 | 8/2008 | Toshima | |
| 2008/0236495 A1 | 10/2008 | Tompa | |
| 2008/0302761 A1* | 12/2008 | Hirayama et al. | 216/67 |
| 2008/0303744 A1* | 12/2008 | Hirayama et al. | 343/900 |
| 2008/0308228 A1* | 12/2008 | Stevenson et al. | 156/345.34 |
| 2008/0317973 A1* | 12/2008 | White et al. | 427/569 |
| 2009/0081878 A1* | 3/2009 | Dhindsa | 438/729 |
| 2009/0236447 A1 | 9/2009 | Panagopoulos et al. | |
| 2009/0324379 A1 | 12/2009 | He et al. | |
| 2009/0325367 A1 | 12/2009 | He et al. | |
| 2010/0092668 A1 | 4/2010 | Hegedus | |
| 2010/0147370 A1 | 6/2010 | He et al. | |
| 2010/0183827 A1* | 7/2010 | Hirayama et al. | 427/575 |
| 2010/0219509 A1 | 9/2010 | He et al. | |
| 2010/0233879 A1 | 9/2010 | Ryan | |
| 2011/0083809 A1* | 4/2011 | de la Llera et al. | 156/345.34 |
| 2011/0114600 A1* | 5/2011 | Hirayama et al. | 216/67 |
| 2011/0121736 A1* | 5/2011 | Hirayama et al. | 315/111.41 |
| 2011/0146910 A1* | 6/2011 | Hirayama et al. | 156/345.43 |
| 2011/0162800 A1* | 7/2011 | Noorbakhsh et al. | 156/345.34 |
| 2011/0180213 A1* | 7/2011 | Hirayama et al. | 156/345.33 |
| 2011/0214812 A1 | 9/2011 | Song et al. | |
| 2012/0027918 A1* | 2/2012 | Tiner et al. | 427/58 |
| 2013/0026136 A1* | 1/2013 | Sasagawa | 216/67 |
| 2014/0209027 A1* | 7/2014 | Lubomirsky et al. | 118/724 |
| 2014/0238608 A1* | 8/2014 | Sabri et al. | 156/345.34 |
| 2014/0246521 A1* | 9/2014 | Tiner et al. | 239/548 |

OTHER PUBLICATIONS

Book: D.M. Dodkin et al., "Principles of Chemical Vapor Deposition", 2003 Kluwer Academic Publishers, Chapter 3, 6 pages.

* cited by examiner

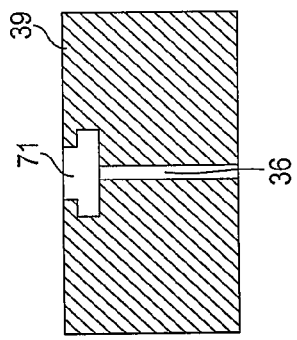
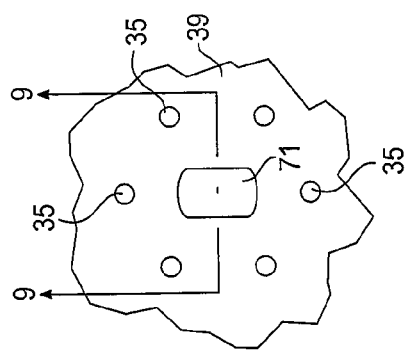
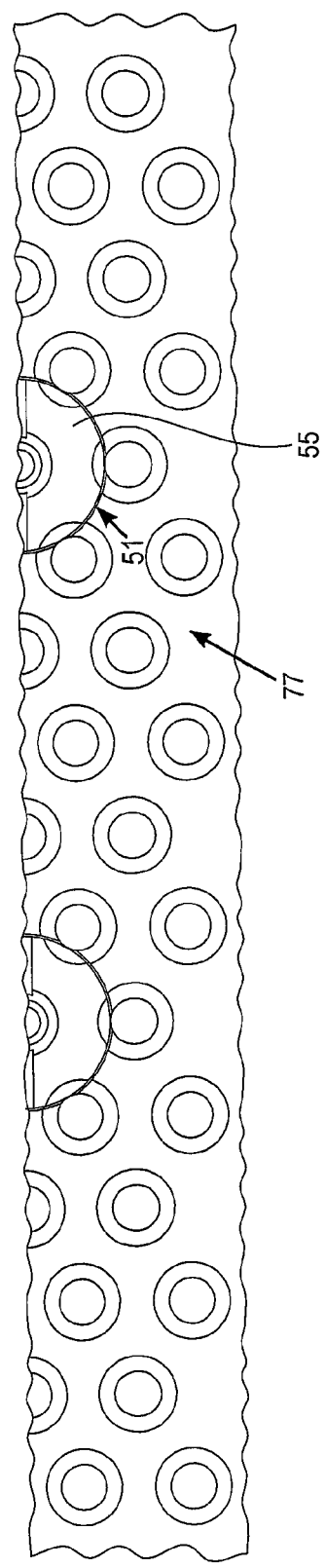

FASTENER SYSTEM FOR SUPPORTING A LINER PLATE IN A GAS SHOWERHEAD REACTOR

TECHNICAL FIELD

The invention relates to gas reactor showerheads and, in particular, to a fastener system for joining a reactor showerhead gas diffuser plate to a liner plate supported over a deposition substrate.

BACKGROUND

In gas reactors, particularly MOCVD reactors, quartz liner plates are used to control temperature. See application Ser. No. 13/316,343 entitled "Diffusers for Making Thermal Gradient Showerheads in a MOCVD Reactor" filed Dec. 9, 2011 by D. Ishikawa et al. and assigned to Alta Devices of Santa Clara, Calif. In the subject application, closely coupled Metal Organic Chemical Vapor Deposition (MOCVD) reactors distribute processing gases through water cooled gas distribution plates that form a portion of showerheads. Water cooling is intended to maintain the showerhead diffuser temperature at approximately 65 degrees Celsius, conservatively below the limit at which processing gas precursors prematurely dissociate and react. Compound semiconductor thin film deposition requires substrate processing at elevated temperatures, often higher than 800 degrees Celsius. Therefore it is necessary to establish and to maintain an extreme thermal gradient (from 800 degrees Celsius to 65 degrees Celsius or broader) between the close coupled showerhead and the substrate. As described in the '343 application, a way to maintain the showerhead-to-substrate temperature gradient involves spacing the substrate apart (up to ten centimeters, for example,) from the showerhead diffuser to minimize heat transfer between the two process surfaces. Spacing of this magnitude efficiently reduces heat transfer. There are benefits to minimizing spacing in order to control gas boundary layer thickness including optimal metal organic precursor utilization and better film uniformity. Precursor utilization and film uniformity affect the economic viability of some MOCVD products such as III/V solar cells produced in high volume. Low cost manufacturing is enabled by processing at ten millimeter or less spacing.

Diffuser to substrate spacing at ten millimeters or less requires an insulating material between the showerhead and the substrate providing a thermal gradient. In prior application Ser. No. 13/316,343, fused quartz glass is described for such use. This glass has low thermal conductivity at high temperature and is commonly used in vacuum processing chambers to insulate interior surfaces. However, introducing fused quartz glass to insulate closely coupled high outlet density, low temperature, showerhead diffuser surfaces is problematic in view of gas flow requirements from the showerhead to the substrate while providing a thermal gradient between the showerhead and the substrate.

The process reactor "ceiling" temperature—that is the temperature of the surface viewed from the substrate—must be precisely controlled. The ceiling temperature principally affects the rate of parasitic reactions and unwanted deposition on the showerhead. For instance, some temperature sensitive dopants diffuse and react on the ceiling and are depleted before depositing on the substrate. Introducing a quartz sheet insulator switches the "ceiling" from an actively water cooled showerhead diffuser to the quartz liner, as described in prior application Ser. No. 13/316,343.

The challenge therefore becomes how to passively control the quartz liner temperature and thus the ceiling temperature. Variables affecting the quartz liner temperature include: quartz thickness, opacity, mass, surface finish, and backside gap control. Of these variables, ceiling temperature uniformity principally depends on precisely controlling the gap (for example to 0.010±0.001 inch) between the diffuser and the backside of the quartz liner. Increasing the gap between the liner and the diffuser causes the liner to get hotter; decreasing the gap (or allowing contact between the liner and the diffuser) causes the liner to get cooler. Moreover, variations in gap thickness across the substrate processing area result in undesirable variations in deposition quality. The need therefore exists, especially for large format showerheads spanning multiple substrates, for a way to position and to retain quartz liners with a uniform and precise backside gap, i.e., the gap between the diffuser and liner.

Gas flow from the diffuser surface through the quartz liner to the substrate must be accomplished without adverse effects on showerhead flow conductance and uniformity. This is challenging for showerheads with high density gas nozzles. Showerhead diffusers with closely spaced nozzles, for example 68 nozzles per square inch arranged in a hexagonal lattice pattern, have limited open surface area available for flush mechanical fastening features. The need therefore exists for a fastener that can engage the diffuser surface without interfering with the regular nozzle pattern.

Prior application Ser. No. 13/316,343 described large format showerhead manufacture using electrical discharge machining (EDM). Quartz liners for these showerheads need to be supported in a way that does not obstruct uniform gas distribution nor interfere with water cooling, nor adversely influence the temperature uniformity of the underlying substrates. An object of the invention is to provide a fastener support system between a showerhead diffuser plate and a liner plate.

SUMMARY

The above object has been achieved with a fastener system that joins two members of a showerhead, namely a diffuser plate to a liner plate using a plurality of individually spaced apart fasteners. Each fastener has a countersunk head in a major surface of the liner plate, a hollow tubular shank, and a radially outwardly extending foot that fits in a keyway of the closely spaced diffuser plate and turns in an arcuate concourse of the diffuser plate wherein the turning foot in the concourse provides bayonet type locking, hereafter termed a "bayonet tip".

The countersunk head and tubular shank allow the fastener to be recessed in and extend through the liner plate. A washer or shim is used to space the liner plate from the diffuser plate. The head engages a hole machined in the surface of the liner plate and is sized to precisely locate the load bearing surface of the countersunk head relative to the liner plate surface. The bayonet tip has an outer profile designed to fit through the keyway in the diffuser. The keyway opens to an arcuate concourse in the diffuser and extends further to a diffuser nozzle. When the tip is turned, it locks in place because the foot is no longer aligned with the keyway. In this manner, the tubular shank allows gas to flow from a showerhead plenum through the diffuser plate and into the tubular shank and then, into a nozzle in the center of the countersunk head in the liner plate. This allows gas to flow from the plenum, through the diffuser

BRIEF DESCRIPTION OF THE DRAWINGS

FIG. 8 is a bottom view of a portion of a diffuser plate for receiving the fastener of FIG. 3.

FIG. 9 is a sectional view of a diffuser plate taken along lines 8-8 in FIG. 9.

FIG. 10 is a top plan view of a nozzle array in a liner plate with a fastener corresponding to the nozzle pattern and fastener shown in FIG. 2.

DETAILED DESCRIPTION

Figure 1:
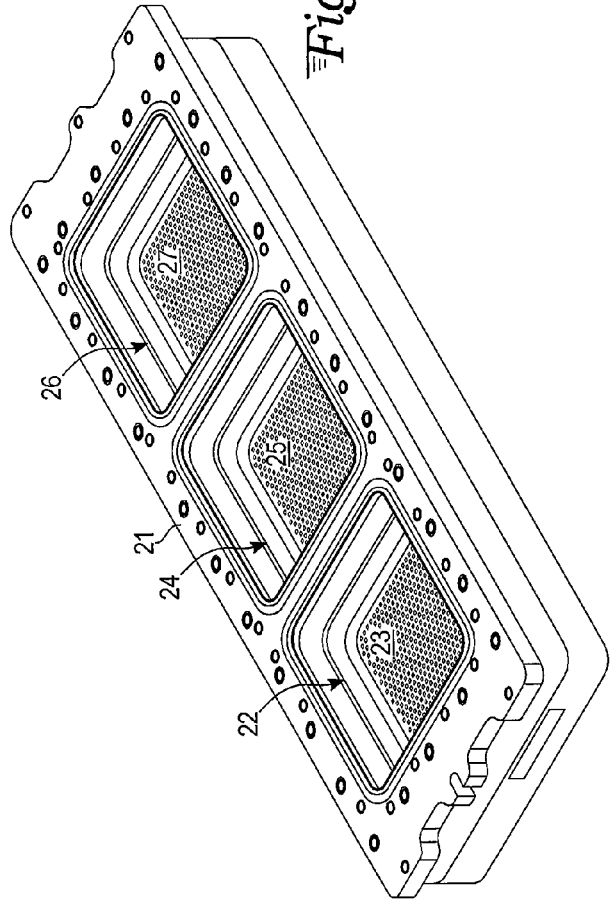
FIG. 1 is a perspective view of a prior art MOCVD showerhead having three gas plenums for dispensing reactant ambient temperature gases through a bottom wall diffuser plates.

With reference to FIG. 1, a prior art showerhead for a MOCVD reactor has a body 21 with three gas plenums 22, 24 and 26 that contain reactant gases at ambient temperature or temperatures slightly above ambient for forming thin semiconductor films on a substrate. At ambient temperatures the reactant gases do not interact and so there is little risk of depositing thin films on plenum walls or, more importantly, in nozzles that exit the bottom wall of the plenum, not seen in FIG. 1. In order to provide a thermal gradient between the low temperature of showerhead body 21 and an underlying substrate, not shown, that is typically heated to 800 degrees C., gas diffuser plates and liner plates are interposed between the heated substrate and the plenum. Diffuser plates 23, 25, 27 form the bottom wall of the plenums 22, 24, and 26. Liner plates are supported below the diffuser plates and above a substrate where thin films are formed. Each liner plate is typically thermally reflective quartz that can remain stable at roughly 400 degrees C. without warping or softening. The diffuser plate is a water cooled stainless steel plate that is joined to the liner plate with a very small spacing therebetween. A small spacing forms a thermal break between the liner plate and the diffuser plate that minimizes heat transfer and increases the temperature of the liner plate by a desired amount, allowing heat gradient formation. While the diffuser plate is part of body 21, or joined to body 21 by bolts, it is necessary to attach the liner plate to the diffuser plate in a manner that maintains a parallel relationship of major surfaces of each member for uniform gas distribution through nozzles in each plate that are aligned. A plurality of fasteners of the present invention are spaced apart among gas nozzles to join the liner plate to the diffuser plate.

Figure 2:
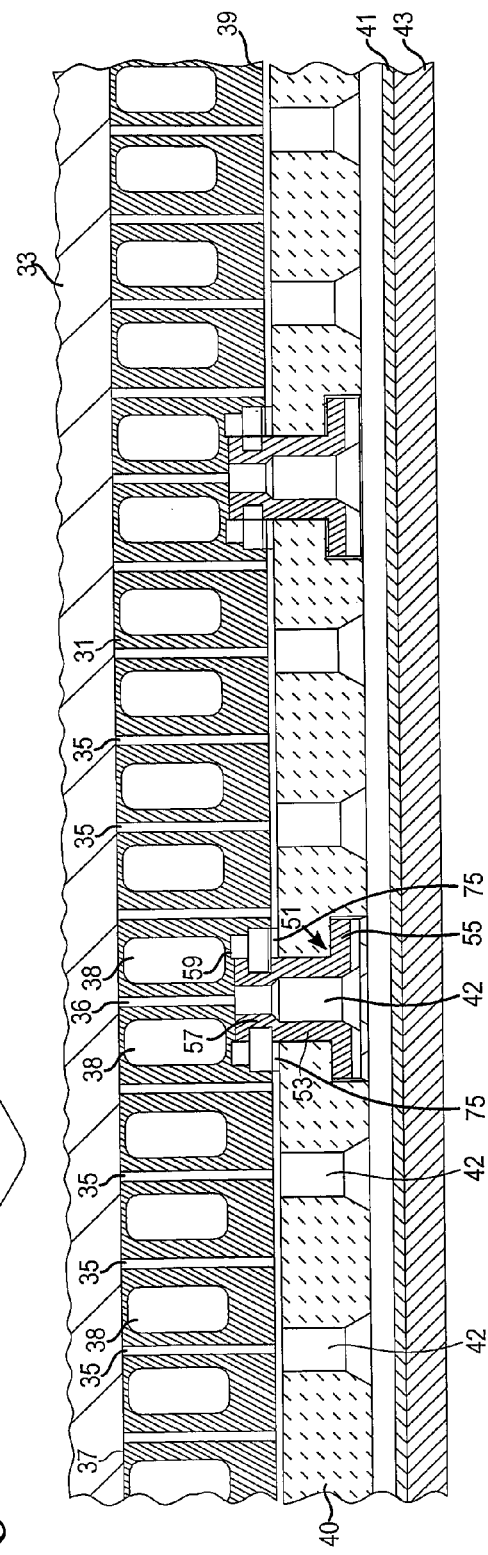
FIG. 2 is a side sectional view of a gas showerhead having a diffuser plate below a gas plenum joined to a liner plate using a fastener of the present invention amidst a nozzle pattern in both plates, all supported above a hot substrate.
Figure 4:
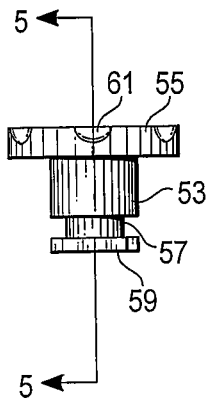
FIG. 4 is a side view of the fastener of FIG. 3.
Figure 5:
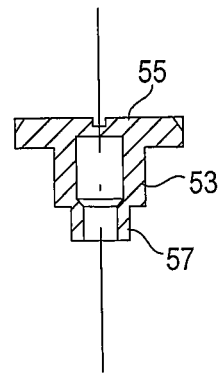
FIG. 5 is a sectional view taken along lines 5-5 in FIG. 4.

In FIG. 2, a water cooled diffuser plate 31, typically made of steel or aluminum, is seen to be a lower boundary member of gas plenum 33 of a showerhead. The diffuser plate has a plurality of parallel gas nozzles 35 that extend from one major surface 37 of the plenum to the opposite, parallel, major surface 39. The gas nozzles 35 communicate reactant gases at ambient temperature from the plenum 33 toward an underlying substrate 41 after passing through a thermal modulator, namely a quartz liner plate 40 that may be slightly spaced from the diffuser plate 31 and has a major surface in a parallel relation with a major surface of the diffuser plate. The liner plate has nozzles that correspond in location to nozzles of the diffuser plate on a one-to-one basis. The liner nozzles 42 are larger in diameter than diffuser nozzles and are outwardly flared toward substrate 42. The section of FIG. 2 seems to show more diffuser than liner nozzles but this is not the case because staggered diffuser nozzles are shown but staggered liner nozzles are not shown. The liner and diffuser nozzles are coaxial with the tubular shank.

The diffuser plate has transverse water channels 38 that circulate flowing fluid coolant, such as water, and maintain the diffuser at a temperature well below temperatures where reactant gases will react. The diffuser plate takes away heat from the nearby liner plate 40 which is, in turn, heated by substrate 41 upon which the reactant gases are forming a thin film by means of MOCVD.

The substrate 41 rests on a susceptor 43 which is usually at the highest temperature of the system. The thin film substrate can reach 800 degrees C., or higher, for MOCVD film formation of a semiconductor structure from reactant gases, e.g., a gallium-arsenide film. In order that reactant gases be uniformly distributed over the substrate, the substrate is spaced a few millimeters from the gas nozzles of the parallel liner plate in order to allow for gas mixing above the substrate and to allow for lateral gas flow escape of unused reactant gases, carrier gas, and partially used gases to exhaust ports, not shown. A thermal gradient exists between the substrate and the gas plenum, with some heat being rejected by the liner plate and some heat being dissipated by the diffuser plate. Some heat is also transferred from the liner plate to the diffuser plate by radiation and conduction. At the same time, the diffuser and liner plates transmit reactant gases through nozzles extending through the diffuser from the plenum towards the substrate. For this reason, nozzles in the diffuser plate should be aligned with nozzles in the liner plate.

In order to join the liner plate to the diffuser plate, a hollow fastener 51 has been devised. Fastener 51 has an axially hollow tubular shank 53 that is mounted to be coaxial with a nozzle 36 in the diffuser. The tubular shank has a portion that extends completely through the liner plate and partly into the diffuser plate. The diameter of the portion of the shank tube in the liner plate is sized to be larger than the diameter of nozzles in the liner. The length of the shank tube extends through the liner plate. Such a profile within the liner has a central hollow gas passageway that is at least the diameter of a diffuser nozzle, preferably larger and optionally tapering from a smaller diameter to a larger diameter. Another shank portion extends into the diffuser plate 31 for a short distance, through a keyway, to an arcuate concourse where it is anchored by a bayonet mechanism described below. To reach the arcuate concourse, a radial foot or bayonet tip must pass through a keyway in the diffuser. Opposite to the foot, fastener 51 has a head 55 with a tubular opening that is at least as wide as the tubular shank, tapering from the shank diameter to a larger diameter at the end of the head distal to the shank. Head 55 has a slot for a turning tool.

In order that a fastener pass through the liner plate, a hole must be drilled or formed in a major surface of the liner that is larger than the diameter of a liner nozzle. If the diameter of a nozzle is 1.9 mm, a typical wall thickness of the tubular shank is 0.5 mm so that the overall tubular diameter is 2.9 mm.

At an end of the fastener distal to the head is a narrowed annular body portion 57 that resides at a shank portion that is beyond the shank portion that resides in the liner plate. Annular body portion 57 is intended to reside in the diffuser plate 31 and is locked to the diffuser plate by a foot 59, or oppositely extending feet, at the extremity of the fastener opposite the head 55, with bayonet tip action. The annular body portion forms an indentation in the tubular body that can be used to seat a washer to provide a slight separation of the fastener from the diffuser, thereby separating the liner and diffuser slightly.

FIGS. 3-7 show details of the fastener showing head 55, the tubular shank 53, annular body portion 57 and foot 59. The head has a shape for being countersunk flush with a major surface of the liner plate in which it is seated. An optional tool slot 63 may be provided for a screwdriver or similar tool. The head has crenellations 61 machined around the head circumference corresponding to the counter bore outer diameter of adjacent gas nozzles. The fastener is preferably made from refractory metal, such as molybdenum, because high purity molybdenum is mechanically robust at high temperature. Furthermore, molybdenum has a high thermal conductivity. This material property is beneficial because it enables the fastener to conduct heat from the fastener head through the shank and to the foot, with bayonet closure relative to the diffuser that is in physical and thermal contact with the water cooled diffuser. This prevents the fastener from becoming too hot and influencing temperature of the substrate directly below the head. In the case where a diffuser is manufactured from stainless steel, it is desirable to manufacture the fastener from molybdenum in order to reduce galling. Dissimilar materials have different coefficients of thermal expansion and are less prone to binding during heating.

Figure 3:
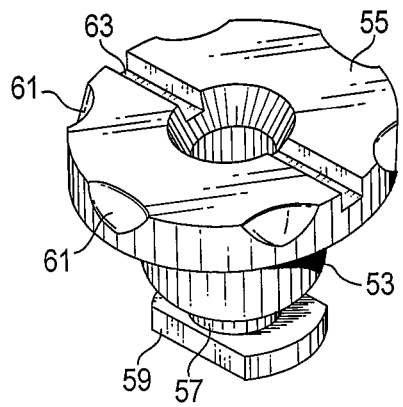
FIG. 3 is a perspective view of the fastener shown in FIG. 2.
Figure 6:
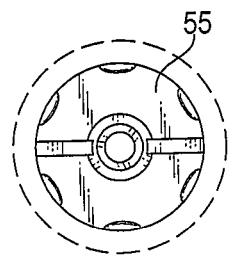
FIG. 6 is a top view of the fastener of FIG. 3.
Figure 7:
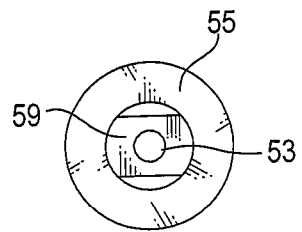
FIG. 7 is a bottom view of the fastener of FIG. 3.

In FIG. 8, the keyway 71 in diffuser surface 39 is seen to be oblong to accommodate the foot 59 seen in FIG. 3. The annular body portion 57 of the fastener fits into the keyway, as does the foot. The foot is turned one-quarter turn to lock the foot in an arcuate slot in the diffuser that provides a bayonet tip closure. Keyway 71, among an array of nozzles 35, is machined into the surface of a diffuser plate to engage the foot of fastener in an arcuate slot machined in the diffuser for bayonet coupling of the fastener with the diffuser.

In FIG. 9, keyway 71 is seen to be an inversion of the foot tip geometry rotated about the axis of the tubular shank, coaxial with nozzle 36. This feature can be produced using a graphite electrode machined to the overall shape of the foot and tubular fastener, plunged and then rotated on a sinker EDM system into diffuser surface 39. An equivalent feature can be produced using a separable CNC plate welded into a shallow pocket. The EDM keyway is preferable because it results in an inseparable part with no welding or other processing required. A washer or shim of selected precise thickness may be used at the annular portion of the fastener that would precisely control the gap between the diffuser plate 39 and the liner plate 40. A washer 75 may be seen in FIG. 2.

In FIG. 10, the placement of the head 55 of a fastener in a field of nozzles 77 in a showerhead liner is such that the head does not block any nozzles. The nozzles of FIG. 10 are intended to correspond to the nozzles of FIG. 2, with a corresponding position of the fastener 51. The crenellations of the head 55 accommodate the nozzles so that no interference of gas nozzles exists.

In operation, the bayonet tip or foot coupling of the fastener inserted through the diffuser keyway joins the liner plate to the diffuser. The fasteners are hollow in order to form a portion of a gas nozzle since the hollow tubular central region is an extension of a diffuser nozzle. This allows placement within a nozzle field in a way that does not deplete gas flow to the substrate, while promoting the thermal gradient that results from placement of a liner between a gas diffuser and a heated substrate. Since it is often desirable to mechanically secure or constrain the liner close to the substrate at a desired spacing, the fastener of the present invention secures the liner to the diffuser by suspension using spacers or shims at existing holes, i.e., the nozzles, rather than by a special support outside the active deposition area. At the same time, gas flow and deposition uniformity is maintained.

A single diffuser can support one or more quartz liners using quarter-turn bayonet fasteners of the type described. This improves thermal uniformity control and significantly reduces particle formation, issues that affect substrate quality and yield. Furthermore, the fastener assembly can adjust using precision washers or shims to accommodate different diffuser to liner spacings, or no spacing. The fastener of the present invention was described as placed within an array of nozzles, but the fastener can be placed anywhere on a given liner. Said another way, the fastener is design such that the counter bore head can retain the liner edge or liner area. This allows the fastener to engage slots or holes in the liner in a way that provides accurate placement to resist quartz deformation at high temperature.

For square substrates, an array of fasteners of the present invention may have fasteners and keyways located in a pattern that accommodates square substrates in with various showerhead designs, such as a $(n^2)$ or $(n+1)^2$ configuration where n is the number of substrates. This is accomplished by locating fastener features over the mid-plane of each square substrate. In this fashion it is possible to use a showerhead for processing $(n^2)$ or $(n+1)^2$ wafers keeping the fastener over seams between substrates in order to minimize any potential adverse flow or thermal non-uniformity effects.

What is claimed is:

1. A fastener for joining two members of a gas showerhead reactor comprising:
   first and second planar members of a gas nozzle array associated with a showerhead of a gas reactor, wherein nozzles in each planar member are aligned for gas passage from one side of the joined members to the opposite side; and
   a hollow fastener fitting into the first and second members, each fastener having a tubular shank extending completely through said one of the first and second members and having a head for stopping passage of the shank beyond a distance in said one of the first and second members with a foot extending from the shank opposite the head at a distance extending partially into the other of the first and second members through a keyway, the tubular shank and foot surrounding a hollow central region forming a nozzle extending completely through said one of the first and second members and partially through the other of the first and second member to a nozzle of the other of the first and second members, the other member having an arcuate concourse communicating with the keyway, whereby the foot may be turned in the concourse, locking the second member to the first member in a bayonet tip manner.

2. The fastener of claim 1 wherein said first and second planar members are spaced apart by a gap.

3. The fastener of claim 2 wherein a washer resides on the tubular shank in said gap.

4. The fastener of claim 1 wherein the foot is an oblong tab having oppositely extending portions extending symmetrically from the tubular shank.

5. The fastener of claim 1 wherein the head fits into a countersunk region of said one of the first and second members.

6. The fastener of claim 1 wherein the diameter of the tubular shank fits closely within the nozzle of said one of the first and second members.

7. The fastener of claim 1 wherein the keyway is a portion of a machined slot in said other member.

8. The fastener of claim 1 wherein the nozzle of the other member is coaxial with the portion of the tubular shank extending into the second member and having a different diameter than the nozzle in said one member.

9. The fastener of claim 1 wherein said one member is a gas showerhead liner.

10. The fastener of claim 1 wherein the other member is a gas showerhead diffuser.

11. A fastener system for joining gas nozzle arrays of a gas diffuser plate and a liner plate in a MOCVD showerhead comprising:
  a liner plate having opposed major surfaces with liner nozzles extending from a first major surface to a second major surface;
  a diffuser plate for dispensing gas from a showerhead having a region parallel to a region of the liner plate where the liner plate and diffuser plates are to be joined together, the diffuser plate having diffuser nozzles corresponding in location to liner nozzles, the diffuser plate having axial keyways in the parallel region aligned with diffuser nozzles, each keyway terminating in an arcuate concourse; and
  fasteners forming at least some of the liner nozzles and forming diffuser nozzles extending partially into the diffuser plate from the liner nozzles of the fasteners to diffuser nozzles outside of the fasteners, each fastener having a tubular shank with opposed first and second ends fitting through the liner plate and allowing gas passage therethrough, with the shank having a head at one end and a foot extending radially outwardly near the opposite end, the shank having sufficient length to pass through the liner plate with the radially extending foot passing along the keyway to the arcuate concourse of the diffuser plate, whereupon turning of the head turns the foot in the concourse in a bayonet tip manner joining the liner plate and the diffuser plate.

12. The system of claim 11 wherein the head is countersunk into a major surface of the liner plate.

13. The system of claim 11 wherein the foot is an oblong tab having oppositely extending portions extending symmetrically from the tubular shank.

14. The system of claim 11 wherein the keyway is coaxial with a nozzle in the diffuser plate.

15. The system of claim 11 wherein the diffuser is cooled by a flowing fluid.

* * * * *